United States Patent
Murphy et al.

(10) Patent No.: US 12,406,539 B2
(45) Date of Patent: Sep. 2, 2025

(54) DIAGNOSTIC PROTOCOL SEARCH WITH IMPROVED EFFICIENCY

(71) Applicant: Robert Bosch GmbH, Stuttgart (DE)

(72) Inventors: Charles Lee Murphy, Forsythe, GA (US); David Stein, Kalamazoo, MI (US)

(73) Assignees: Bosch Automotive Service Solutions, Inc., Warren, MI (US); Robert Bosch GmbH, Stuttgart (DE)

(*) Notice: Subject to any disclaimer, the term of this patent is extended or adjusted under 35 U.S.C. 154(b) by 157 days.

(21) Appl. No.: 18/377,438

(22) Filed: Oct. 6, 2023

(65) Prior Publication Data

US 2025/0118116 A1    Apr. 10, 2025

(51) Int. Cl.
G07C 5/08 (2006.01)
B60R 16/02 (2006.01)
G01R 19/25 (2006.01)
B60R 16/023 (2006.01)

(52) U.S. Cl.
CPC ....... *G07C 5/0808* (2013.01); *G01R 19/2503* (2013.01); *B60R 16/023* (2013.01); *G07C 2205/02* (2013.01)

(58) Field of Classification Search
None
See application file for complete search history.

(56) References Cited

U.S. PATENT DOCUMENTS

| | | | |
|---|---|---|---|
| 8,412,401 B2* | 4/2013 | Bertosa | G07C 5/006 340/439 |
| 11,810,404 B2* | 11/2023 | Qu | G07C 5/085 |
| 2010/0217900 A1* | 8/2010 | McClure | H04L 12/4135 710/72 |
| 2017/0024942 A1* | 1/2017 | Drew | G07C 5/008 |
| 2018/0225891 A1* | 8/2018 | Lambourne | H01R 13/6397 |

* cited by examiner

Primary Examiner — Abdhesh K Jha
(74) Attorney, Agent, or Firm — David Kovacek

(57) ABSTRACT

A system and method for efficiently determining a diagnostic protocol used by a vehicle under service and instantiating service appropriately. The diagnostic protocol is checked for expected electrical behaviors exhibited at the pins of a diagnostic port of a vehicle. If the expected behaviors are observed, a first protocol is designated for use. If the expected behaviors are not observed, other protocols are test for appropriate designation.

20 Claims, 4 Drawing Sheets

DIAGNOSTIC PROTOCOL SEARCH WITH IMPROVED EFFICIENCY

TECHNICAL FIELD

This disclosure relates to vehicle diagnostics, and more particularly, the utilization of specialized tools to perform vehicle diagnostic actions.

BACKGROUND

Modern vehicles utilize computing processors to control various functions of the vehicle. These processors communicate with each other and external devices via a communication bus, commonly referred to as a diagnostic bus. The diagnostic bus of a vehicle is available for interfacing with external tools suitable for a user to acquire diagnostic information indicating the operating condition of one or more components of the vehicle.

However, different vehicles of different makes and models and years of manufacture may be compatible with different diagnostic languages, referred to as diagnostic protocols. Different diagnostic protocols utilize different communication standards and messages. Interfacing with a diagnostic bus using the wrong diagnostic protocol is not only ineffective but can also cause additional errors in the operation of components in communication with the diagnostic bus. It is therefore important for a technician performing a diagnostic action or service action to utilize the proper diagnostic protocol when interfacing with a diagnostic bus of a vehicle. Determining the appropriate diagnostic protocol for use with a particular vehicle can be a time-consuming process.

What is desired is a method for determining the specific diagnostic protocol used by the diagnostic bus of any vehicle. The method for determination should be accurate and efficient, to provide a technician performing a diagnostic action or a service action the ability to begin the desired action as quickly as possible.

SUMMARY

One aspect of this disclosure is directed to a method for instantiating a vehicle diagnostic action. The method comprises establishing electrical contact between a diagnostic tool and a plurality of pins of a diagnostic port of a vehicle. The method further comprises monitoring the operating conditions of a plurality of pins of the diagnostic port. A first pin is monitored for a first expected voltage behavior with respect to a neutral ground. A second pin is monitored for a second expected voltage behavior with respect to the neutral ground. When both of the first pin and the second pin exhibit the expected voltage behavior, it is understood that a first diagnostic protocol is in use. Otherwise, if at least one of the pins does not exhibit the expected voltage behavior, a different protocol is understood to be in use. In response to this determination, an ordered protocol selection can be initiated to designate the designated protocol from an ordered list of compatible diagnostic protocols. Once the protocol has been determined and designated as the operating protocol, a request can be generated by the diagnostic tool to the vehicle for vehicle identification data. Once the vehicle identification data has been received, the diagnostic tool can determine the make, model, and year of manufacture for the vehicle to further interpret diagnostic information provided by the vehicle during the rest of the diagnostic action or service action.

Another aspect of this disclosure is directed to a method for instantiating a vehicle diagnostic action. The method comprises establishing electrical contact between a diagnostic tool and a plurality of pins of a diagnostic port of a vehicle. The method further comprises monitoring the operating conditions of a plurality of pins of the diagnostic port. A first pin is monitored for a first expected impedance with respect to a neutral ground. A second pin is monitored for a second expected impedance with respect to the neutral ground. When both of the first pin and the second pin exhibit the expected impedance, it is understood that a first diagnostic protocol is in use. Otherwise, if at least one of the pins does not exhibit the expected voltage behavior, a different protocol is understood to be in use. In response to this determination, an ordered protocol selection can be initiated to designate the designated protocol from an ordered list of compatible diagnostic protocols. Once the protocol has been determined and designated as the operating protocol, a request can be generated by the diagnostic tool to the vehicle for vehicle identification data. Once the vehicle identification data has been received, the diagnostic tool can determine the make, model, and year of manufacture for the vehicle to further interpret diagnostic information provided by the vehicle during the rest of the diagnostic action or service action. In some embodiments the impedance between the pins may be monitored as an additional check before determining whether the first protocol is appropriate for use.

The above aspects of this disclosure and other aspects will be explained in greater detail below with reference to the attached drawings.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 1:
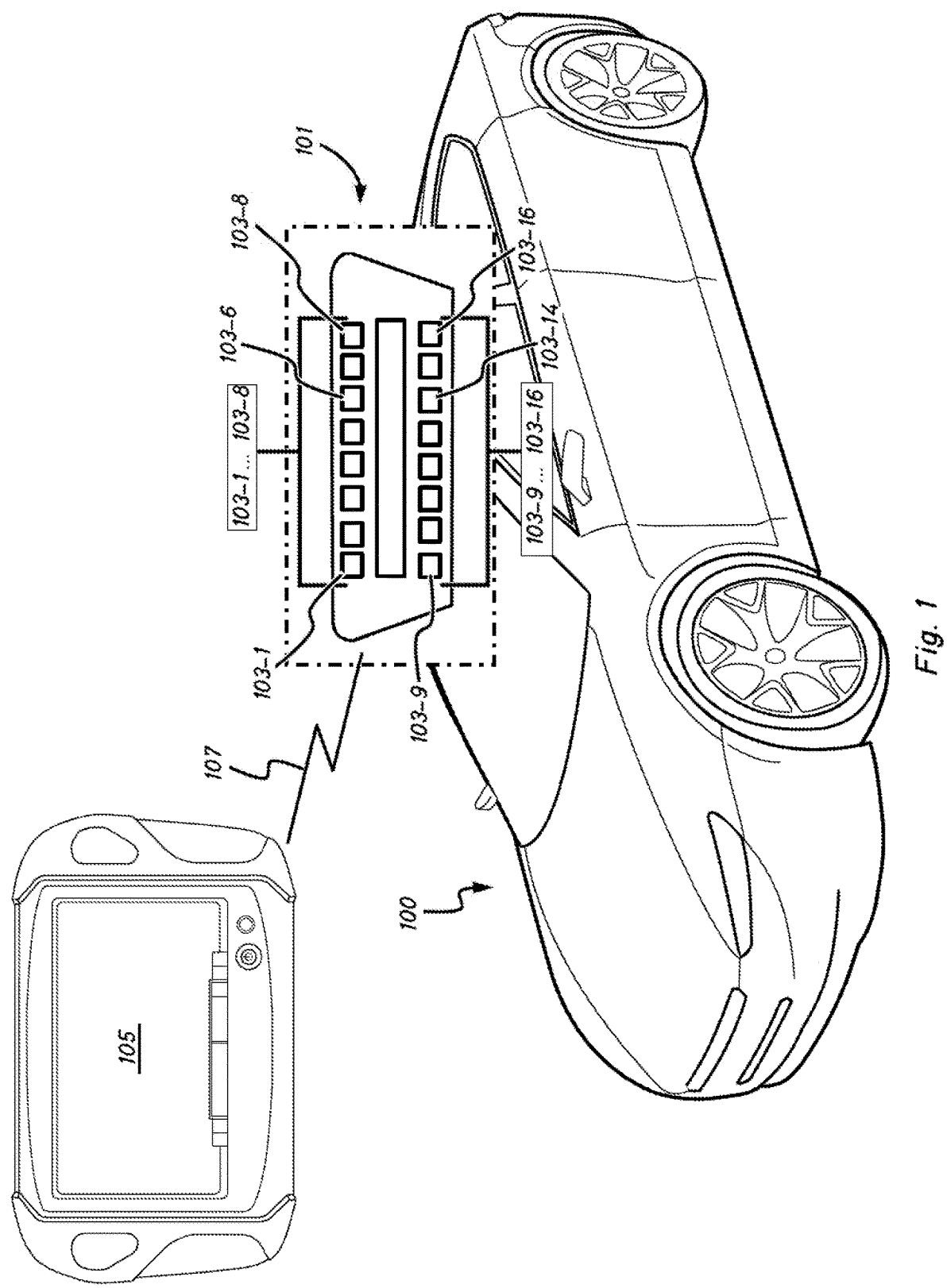
FIG. 1 is a diagrammatic illustration of a diagnostic tool and diagnostic port of a vehicle.

FIG. 1 presents a diagrammatic view of a vehicle 100 under service. In the context herein, "service" is used to describe active changes to vehicle hardware or software (such as from a repair or a maintenance action) as well as diagnostic operations to determine the status of a vehicle. In the depicted embodiment, vehicle 100 comprises a consumer sedan, but the make and model of the vehicle can comprise any configuration without deviating from the teachings disclosed herein. In some such embodiments, vehicle 100 may comprise a sedan, compact car, light truck, motorcycle, recreational vehicle, off-road vehicle, side-by-side vehicle, commercial transport vehicle, bus, limousine, sport utility vehicle, crossover vehicle, full-sized van, minivan, station wagon, truck, or any other vehicle without deviating from the teachings disclosed herein. In some embodiments, vehicle 100 may comprise a watercraft or aircraft without deviating from the teachings disclosed herein.

Vehicle 100 comprises a diagnostic port 101 having a number of pins 103. In the depicted embodiment, diagnostic port 101 comprises a port suitable for connection using the onboard diagnostic (OBD) protocols, but other embodiments may comprise other configurations without deviating from the teachings disclosed herein. In the depicted embodiment, each of pins 103 is capable of receiving or transmitting electrical signals, including electrical signals carrying information. In the depicted embodiment, diagnostic port 101 comprises sixteen (16) pins 103, conventionally labelled as pins 1-16. In this depiction, the top row of pins 103 comprises a grouping of pins 103-1 to 103-8 (pins 1 to 8 outside of the context of these teachings). The bottom row of pins 103 comprises a grouping of pins 103-9 to 103-16 (pins 9 to 16 outside of the context of these teachings). For convenience in understanding the illustration, pins 103-1, 103-6, 103-8, 103-9, 103-14, and 103-16 have been additionally labeled.

Vehicle 100 is in data communication with a diagnostic tool 105 via a data connection 107. In the depicted embodiment, diagnostic tool 105 comprises a specialized diagnostic processing device, but other embodiments may comprise other configurations without deviating from the teachings disclosed herein. In such embodiments, diagnostic tool 105 may be embodied as a mobile processing device, a smartphone, a tablet computer, a laptop computer, a wearable computing device, a desktop computer, a personal digital assistant (PDA) device, a handheld processor device, a specialized processor device, a system of processors distributed across a network, a system of processors configured in wired or wireless communication, or any other alternative embodiment known to one of ordinary skill in the art. In any such embodiment, diagnostic tool 105 will necessarily have a way to interface with diagnostic port 101.

In the depicted embodiment, data connection 107 comprises a wired electric connection conforming to an OBD-II protocol standard, but other embodiments may comprise other connections without deviating from the teachings disclosed herein.

Data connection 107 may comprise a wired connection (as depicted), or may comprise a wireless connection. Wired embodiments of data connection 107 may comprise a TCP/IP connection, a local area network (LAN) connection, a plain-old-telephone-service (POTS) connection, an Internet protocol connection, an electrical wiring, a conductive channel, an electrical bus, a fiber optic pathway, or any other alternative embodiment known to one of ordinary skill in the art. Wireless embodiments of data connection 107 may comprise may be configured to communicate wirelessly via one or more of an RF (radio frequency) specification, cellular phone channels (analog or digital), cellular data channels, a Bluetooth specification, a Wi-Fi specification, a satellite transceiver specification, infrared transmission, a Zigbee specification, Local Area Network (LAN), Wireless Local Area Network (WLAN), or any other alternative configuration, protocol, or standard known to one of ordinary skill in the art.

Diagnostic tool 105 advantageously is compatible with a variety of diagnostic protocols that may be utilized by vehicle 100 and diagnostic port 101. Selection of an appropriate diagnostic protocol is important because transmitting messages formatted for an improper protocol yields unwanted results. Communications utilizing an inappropriate diagnostic protocol can result in misinterpreted data, create additional error conditions within the vehicle, and generally slow the service of the vehicle until the appropriate diagnostic protocol is determined and utilized instead.

The process of determining and designating a diagnostic protocol to use with vehicle 100 should therefore be performed accurately prior to any service actions or diagnostic actions taking place. Smart selection of a compatible diagnostic protocol for test by diagnostic tool 107 can reduce the time spent determining which protocol to use.

A very common family of diagnostic protocols in modern vehicles is the Controller Area Network (CAN) protocol. CAN protocols exist broadly in two categories: "busy CAN" (sometimes referred to as "noisy CAN") can be observed using passive observation of the pins of the diagnostic port 101. A busy CAN signal will be observable passively by the diagnostic tool 107 without first transmitting a request for information. The observation of a busy CAN signal can be accomplished by observing coherent data traffic that conforms to the CAN protocol: observing modulations on particular pins 103 that are understood by diagnostic tool 105 to be CAN messages, even if no message is requested.

However, so-called "silent CAN" protocols utilize CAN formatting and messages, but do not exhibit passively detectable coherent data traffic at the diagnostic port. However, silent CAN protocols do exhibit electrically measurable behaviors at the pins of diagnostic port 101 that can be measured without transmitting a request for information.

In conventional methods, an ordered list of compatible protocols is checked in a specific sequence chosen so as not to cause additional error signals or other complications in service that may be caused by inappropriately formatted messages. In such sequences, CAN is typically checked near the end of the ordered list because of the nuances of the messages being sent. However, because CAN protocols are very common, and because of even silent CAN protocols exhibit measurable behaviors, it is advantageous to perform these measurements to determine if a CAN protocol is present as early in the process as possible to minimize time spent determining the diagnostic protocol that should be designated for use by diagnostic tool 105.

CAN signals can be measured using voltage or impedance at pins 103-6 and 103-14. Because these measurements do not require interaction between the diagnostic tool 105 and any processors of vehicle 100, identity of a CAN protocol can take place much more quickly than a call-and-response check for other protocols.

In the depicted embodiment, voltage of pins 103-6 (pin 6) and 103-14 (pin 14) can be checked compared to a neutral ground to the pins. If both pins 103-6 and 103-14 exhibit an expected voltage behavior, it can be understood that vehicle 100 utilizes a CAN protocol.

In the depicted embodiment, a CAN signal will exhibit on pins 103-6 and 103-14 a dynamic voltage signal with a peak value varying between 0V and 5V with respect to ground. The signal should additionally have an average peak value between 0V and 5V, and in the depicted embodiment will exhibit an average peak value of 2.5V. Some tolerances may additionally be exhibited, such as 10% variance from the average peak value, without deviating from the teachings disclosed herein. If each of pins 103-6 and 103-14 exhibit the expected voltage signal, it can be inferred that vehicle 100 utilizes a CAN protocol, and the diagnostic tool 105 can instantiate service functions.

Although in the depicted embodiment the measurements are performed on pins 103-6 and 103-14, other embodiments may utilize other pins or additional pins to address different "busy" protocols without deviating from the teachings disclosed herein. Although in the depicted embodiment each of pins 103-6 and 103-14 are measured to test for the same expected voltage behavior, other embodiments may utilize different expected voltage behaviors for one or more of the pins under test without deviating from the teachings disclosed herein.

Alternatively, diagnostic tool 105 can measure impedances of pins 103-6 and 103-14 to assess for a CAN signal. In the depicted embodiment, if pin 103-6 and pin 103-14 each exhibit an expected impedance with respect to ground, it can be inferred that vehicle 100 utilizes a CAN protocol.

In the depicted embodiment, a CAN signal will exhibit on pins 103-6 and 103-14 an impedance value between 50 and 70 ohms with respect to ground. The expected impedance for each of the pins in this depicted embodiment is an expected impedance value of 60 ohms with respect to ground. Some tolerances may additionally be exhibited, such as 10% variance from the impedance value, without deviating from the teachings disclosed herein. If each of pins 103-6 and 103-14 exhibit the expected impedance with respect to ground, it can be inferred that vehicle 100 utilizes a CAN protocol, and the diagnostic tool 105 can instantiate service functions.

Although in the depicted embodiment the measurements are performed on pins 103-6 and 103-14, other embodiments may utilize other pins or additional pins to address different "busy" protocols without deviating from the teachings disclosed herein. Although in the depicted embodiment each of pins 103-6 and 103-14 are measured to test for the same expected impedance, other embodiments may utilize different expected impedances for one or more of the pins under test without deviating from the teachings disclosed herein.

In another alternative measurement, a CAN protocol will exhibit an expected impedance between pins 103-6 and 103-14. Diagnostic tool 105 can measure the impedance across the two pins, and if the measurement exhibits the expected impedance, it can be inferred that a CAN protocol is being used by the pins. In the depicted embodiment, an expected impedance across the pins is in the range of 100 ohms and 140 ohms. The nominal expected impedance across the pins is 120 ohms, although some tolerances may additionally be exhibited, such as 10% variance from the impedance value, without deviating from the teachings disclosed herein.

Although in the depicted embodiment the measurements are performed across pins 103-6 and 103-14, other embodiments may utilize other pins or additional pins to address different diagnostic protocols without deviating from the teachings disclosed herein.

In some embodiments, diagnostic tool 105 may make measurements of voltage and impedance to ensure accuracy of the determination of a CAN protocol without deviating from the teachings disclosed herein. In such embodiments, because the electrical measurements are each so much faster than a call-and-response loop of other known diagnostic protocols, it is still advantageously faster to quickly determine the CAN protocol on average, as the protocol that is most expected is a CAN protocol.

In the depicted embodiment, if a CAN protocol is not discerned via the electrical measurements, the diagnostic tool 105 instead initiates an ordered protocol selection to determine a designated protocol for use with vehicle 100. The ordered protocol selection relies upon an ordered list of compatible diagnostic protocols compatible with diagnostic tool 105. In the depicted embodiment, diagnostic tool 105 is compatible with CAN protocols, but also additional protocols. The additional protocols include ISO 9141, ISO 14230, J1850 VPW, or J1850 PWM. Other embodiments may utilize a different list of protocols having additional or different protocol compatibility without deviating from the teachings disclosed herein. The ordered list of compatible diagnostic protocols may be ordered in any sequence without deviating from the teachings disclosed herein.

Once the diagnostic protocol utilized by vehicle 100 is determined, the service may begin. In the depicted embodiment, the first step of the service is instantiation of vehicle identification data to describe vehicle 100, such as a vehicle identification number (VIN). Diagnostic tool 105 requests the vehicle identification data from the vehicle 100 via diagnostic port 101. In the depicted embodiment, diagnostic tool 105 can determine the exact make, model, and year of manufacture for vehicle 100 based upon the vehicle identification data, either in a lookup function of internal memory (not shown) of diagnostic tool 105, or by consulting an external database (not shown). Once the make, model, and year of manufacture of vehicle 100 is determined along with the diagnostic protocol, diagnostic tool 105 has sufficient information to readily interpret all diagnostic messages generated by vehicle 100 during service.

Figure 2:
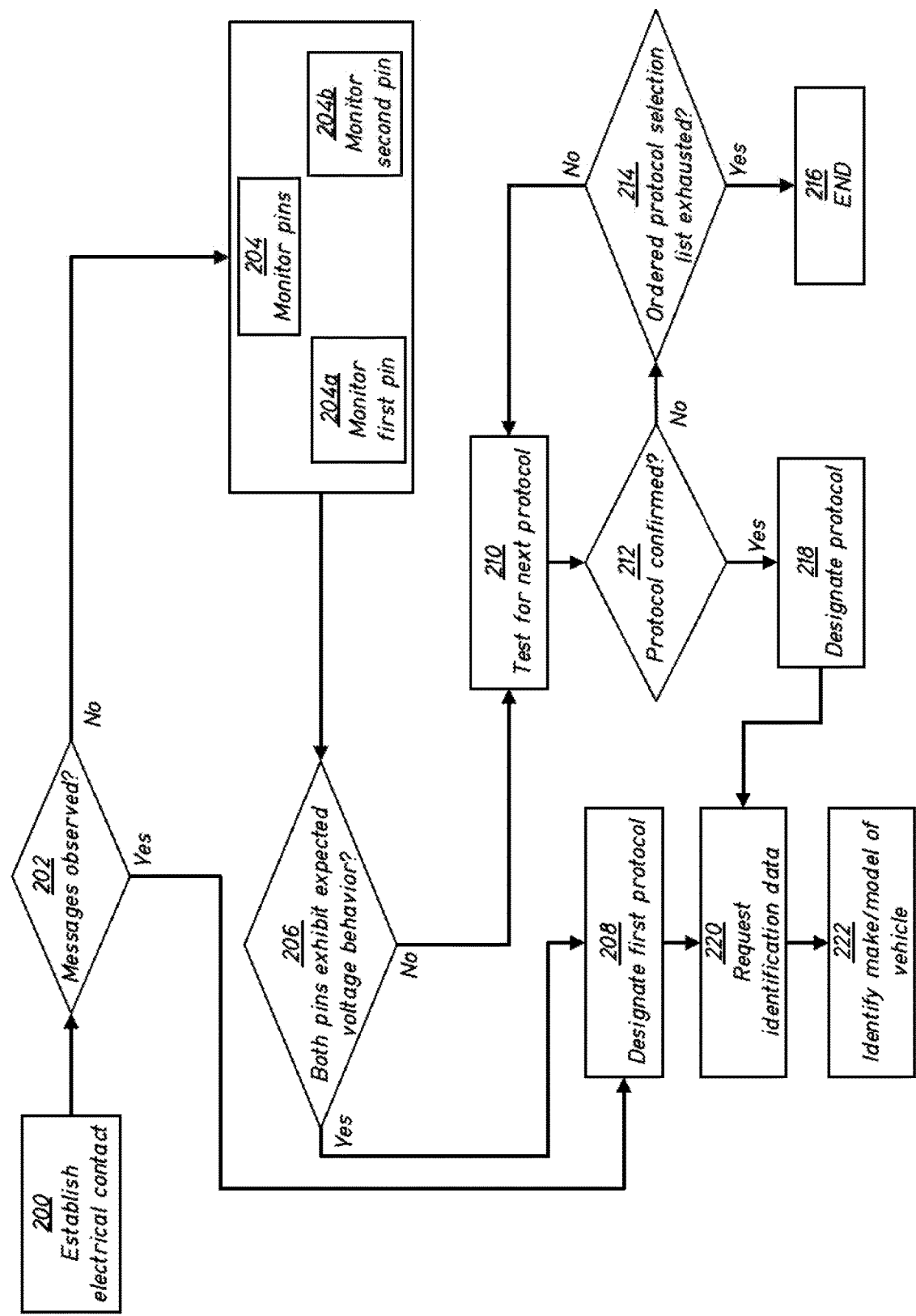
FIG. 2 is a flowchart illustrating a method for instantiating a diagnostic action for a vehicle.

FIG. 2 is a flowchart illustrating a method of initiating and instantiating a diagnostic communication between a vehicle under service (such as vehicle 100; see FIG. 1) and a diagnostic tool (such as diagnostic tool 105; see FIG. 1).

The method begins at step 200 where electrical contact between the diagnostic tool and a diagnostic port (such as diagnostic port 101; see FIG. 1) is established. In the depicted embodiment, the diagnostic port comprises a port conforming to an onboard diagnostic type II protocol (OBD-II), other embodiments may comprise other diagnostic port configurations without deviating from the teachings disclosed herein.

After electrical contact is established, the diagnostic port is passively observed for messages conforming to a first protocol at step 202. In the depicted embodiment, the first protocol is a CAN protocol, but other embodiments may utilize other first protocols without deviating from the teachings disclosed herein. In the depicted embodiment, the diagnostic port is observed for a predetermined amount of time defining a predetermined observation window. The predetermined observation window may be advantageously selected to conform to a messaging frequency of the first diagnostic protocol, or a multiple thereof. If the messages are observed, the first diagnostic protocol can be designated for use by the diagnostic tool (see step 208). Otherwise, the method proceeds to step 204 to check for the first protocol using electrical measurements.

At step 204, a number of pins of the diagnostic port are monitored for expected voltage behavior. In the depicted embodiment, two sub-steps 204a and 204b are utilized to monitor 2 pins, but other embodiments may comprise a different number of sub-steps without deviating from the teachings disclosed herein. In the depicted embodiment, sub-step 204a measures pin 6 of the diagnostic port and sub-step 204b measures pin 14 of the diagnostic port, but other embodiments may comprise different or additional pins without deviating from the teachings disclosed herein.

In the depicted embodiment, sub-steps 204a and 204b happen at least partially concurrently, but other embodiments may process the sub-steps thereof in any sequence, partially concurrently, or completely concurrently without deviating from the teachings disclosed herein.

In the depicted embodiment, pins 6 and 14 are monitored for an expected voltage with respect to a ground for a CAN signal. A CAN signal will exhibit a dynamic voltage signal with a peak value varying between 0V and 5V with respect to ground on pins 6 and 14. The monitored signal should additionally have an average peak value between 0V and 5V, and in the depicted embodiment should exhibit an average peak value of 2.5V. Some tolerances may additionally be exhibited, such as 10% variance from the average peak value, without deviating from the teachings disclosed herein.

At step 206, if each of pins 6 and 14 exhibit the expected voltage signal behavior, it is understood that the diagnostic port utilizes a CAN protocol, and this protocol is designated as the protocol for use at step 208. If one or both pins do not exhibit the expected voltage behavior, a CAN protocol cannot be inferred, and instead the method continues to step 210, where a next protocol from an ordered list of compatible protocols is tested instead. In the depicted embodiment, the ordered list of compatible protocols may include ISO 9141, ISO 14230, J1850 VPW, or J1850 PWM. Other embodiments may comprise a different combination of protocols having different or additional protocols without deviating from the teachings disclosed herein. Other embodiments may comprise a different order within the ordered list of protocols without deviating from the teachings disclosed herein.

If the next protocol is not confirmed to be the correct protocol for use at step 212, the method proceeds to step 214 where it is determined as to whether the ordered list of compatible protocols has been exhausted. If the list has been exhausted, the method ends at step 216, because the vehicle under service does not utilize a diagnostic protocol that is compatible with the diagnostic tool. However, if the ordered list has not been exhausted, the method instead returns to step 210, where the next protocol of the ordered list is tested.

When a compatible protocol is found and confirmed to be appropriate for use with the vehicle at step 212, the method proceeds to step 218 where the protocol is designated for use in the service.

Once a protocol is designated for use (either at step 208 with the CAN protocol or at step 218 with one of the compatible protocols from the ordered list), the method proceeds to step 220 to requested vehicle identification data from the vehicle under service. In the depicted embodiment, vehicle identification data comprises a vehicle identification number (VIN), but other embodiments may utilize different or additional data for vehicle identification purposes without deviating from the teachings disclosed herein. After receipt of the vehicle identification data is received from the vehicle, the vehicle is identified by its make, model, and year of manufacturer at step 222. Once the diagnostic protocol, make, model, and year of manufacture are identified, the service has been properly instantiated, and different methods for service actions or diagnostic actions may proceed.

Figure 3:
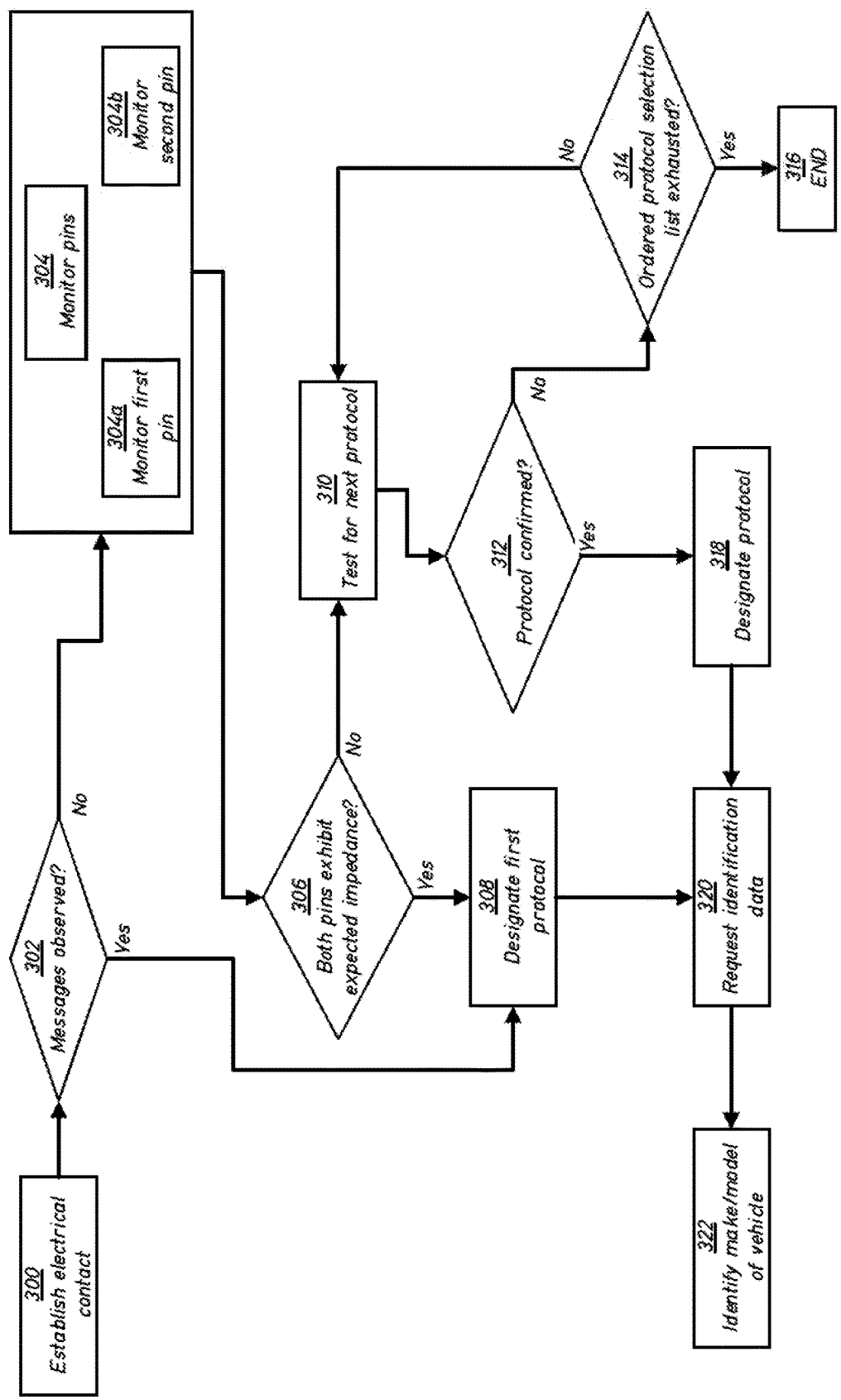
FIG. 3 is a flowchart illustrating a method for instantiating a diagnostic action for a vehicle.

FIG. 3 is a flowchart illustrating an alternative method of initiating and instantiating a diagnostic communication between a vehicle under service (such as vehicle 100; see FIG. 1) and a diagnostic tool (such as diagnostic tool 105; see FIG. 1).

The method begins at step 300 where electrical contact between the diagnostic tool and a diagnostic port (such as diagnostic port 101; see FIG. 1) is established. In the depicted embodiment, the diagnostic port comprises a port conforming to an onboard diagnostic type II protocol (OBD-II), other embodiments may comprise other diagnostic port configurations without deviating from the teachings disclosed herein.

After electrical contact is established, the diagnostic port is passively observed for messages conforming to a first protocol at step 302. In the depicted embodiment, the first protocol is a CAN protocol, but other embodiments may utilize other first protocols without deviating from the teachings disclosed herein. In the depicted embodiment, the diagnostic port is observed for a predetermined amount of time defining a predetermined observation window. The predetermined observation window may be advantageously selected to conform to a messaging frequency of the first diagnostic protocol, or a multiple thereof. If the messages are observed, the first diagnostic protocol can be designated for use by the diagnostic tool (see step 308). Otherwise, the method proceeds to step 304 to check for the first protocol using electrical measurements.

At step 304, a number of pins of the diagnostic port are monitored for expected impedance values. In the depicted embodiment, two sub-steps 304a and 304b are utilized to monitor 2 pins, but other embodiments may comprise a different number of sub-steps without deviating from the teachings disclosed herein. In the depicted embodiment, sub-step 304a measures the impedance of pin 6 of the diagnostic port with respect to ground and sub-step 304b measures the impedance of pin 14 of the diagnostic port with respect to ground. Other embodiments may comprise different or additional pins without deviating from the teachings disclosed herein.

In the depicted embodiment, sub-steps 304a and 304b happen at least partially concurrently, but other embodiments may process the sub-steps thereof in any sequence, partially concurrently, or completely concurrently without deviating from the teachings disclosed herein.

In the depicted embodiment, pins 6 and 14 are monitored for an expected impedance with respect to a ground for measurements complying with a CAN protocol. A CAN protocol will exhibit an impedance of 50-70 ohms on each of pins 6 and 14 with respect to ground. In the depicted embodiment, each of pin 6 and pin 14 are expected to exhibit an impedance of 60 ohms with respect to ground. Some tolerances may additionally be exhibited, such as 10% variance from the impedance, without deviating from the teachings disclosed herein.

At step 306, if each of pins 6 and 14 exhibit the expected impedance, it is understood that the diagnostic port utilizes a CAN protocol, and this protocol is designated as the protocol for use at step 308. If one or both pins do not exhibit the expected impedance, a busy CAN protocol cannot be inferred, and instead the method continues to step 310, where a next protocol from an ordered list of compatible protocols is tested instead. In the depicted embodiment, the ordered list of compatible protocols may include silent CAN, ISO 9141, ISO 14230, J1850 VPW, or J1850 PWM. Other embodiments may comprise a different combination of protocols having different or additional protocols without deviating from the teachings disclosed herein. Other embodiments may comprise a different order within the ordered list of protocols without deviating from the teachings disclosed herein.

If the next protocol is not confirmed to be the correct protocol for use at step 312, the method proceeds to step 314 where it is determined as to whether the ordered list of compatible protocols has been exhausted. If the list has been exhausted, the method ends at step 316, because the vehicle under service does not utilize a diagnostic protocol that is compatible with the diagnostic tool. However, if the ordered list has not been exhausted, the method instead returns to step 310, where the next protocol of the ordered list is tested.

When a compatible protocol is found and confirmed to be appropriate for use with the vehicle at step 312, the method proceeds to step 318 where the protocol is designated for use in the service.

Once a protocol is designated for use (either at step 308 with the CAN protocol or at step 318 with one of the compatible protocols from the ordered list), the method proceeds to step 320 to requested vehicle identification data from the vehicle under service. In the depicted embodiment, vehicle identification data comprises a vehicle identification number (VIN), but other embodiments may utilize different or additional data for vehicle identification purposes without deviating from the teachings disclosed herein. After receipt of the vehicle identification data is received from the vehicle, the vehicle is identified by its make, model, and year of manufacturer at step 322. Once the diagnostic protocol, make, model, and year of manufacture are identified, the service has been properly instantiated, and different methods for service actions or diagnostic actions may proceed.

Figure 4:
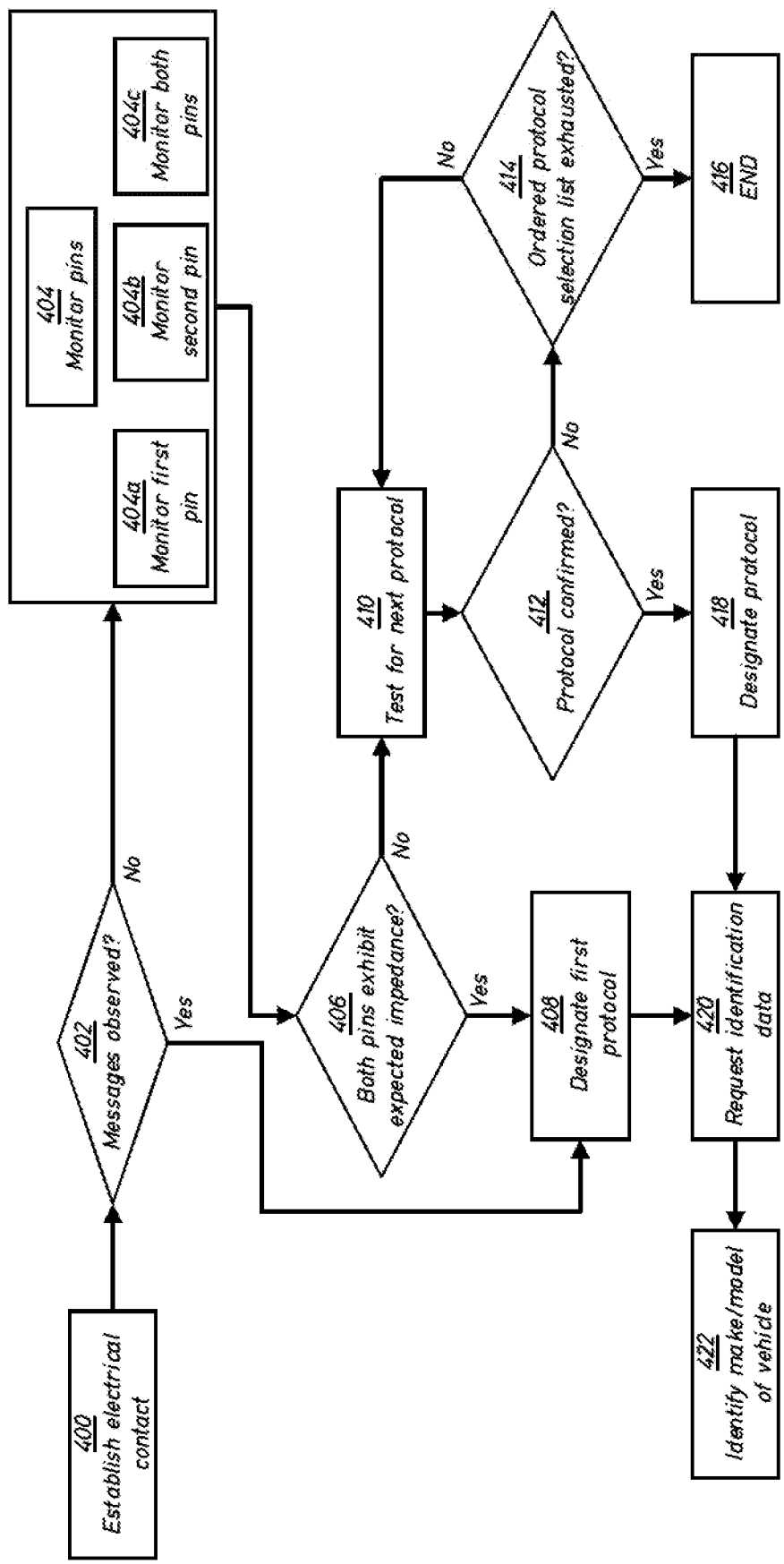
FIG. 4 is a flowchart illustrating a method for instantiating a diagnostic action for a vehicle.

FIG. 4 is a flowchart illustrating an alternative method of initiating and instantiating a diagnostic communication between a vehicle under service (such as vehicle 100; see FIG. 1) and a diagnostic tool (such as diagnostic tool 105; see FIG. 1).

The method begins at step 400 where electrical contact between the diagnostic tool and a diagnostic port (such as diagnostic port 101; see FIG. 1) is established. In the depicted embodiment, the diagnostic port comprises a port conforming to an onboard diagnostic type II protocol (OBD-II), other embodiments may comprise other diagnostic port configurations without deviating from the teachings disclosed herein.

After electrical contact is established, the diagnostic port is passively observed for messages conforming to a first protocol at step 402. In the depicted embodiment, the first protocol is a CAN protocol, but other embodiments may utilize other first protocols without deviating from the teachings disclosed herein. In the depicted embodiment, the diagnostic port is observed for a predetermined amount of time defining a predetermined observation window. The predetermined observation window may be advantageously selected to conform to a messaging frequency of the first diagnostic protocol, or a multiple thereof. If the messages are observed, the first diagnostic protocol can be designated for use by the diagnostic tool (see step 408). Otherwise, the method proceeds to step 404 to check for the first protocol using electrical measurements.

At step 404, a number of pins of the diagnostic port are monitored for expected impedance values. In the depicted embodiment, three sub-steps 404a, 404b, and 404c are utilized to monitor 2 pins, but other embodiments may comprise a different number of sub-steps without deviating from the teachings disclosed herein. In the depicted embodiment, sub-step 404a measures the impedance of pin 6 of the diagnostic port with respect to ground and sub-step 404b measures the impedance of pin 14 of the diagnostic port with respect to ground. Sub-step 404c measures the impedance across pin 6 and pin 14 as electrical terminals. Other embodiments may comprise different or additional pins without deviating from the teachings disclosed herein.

In the depicted embodiment, sub-steps 404a and 404b happen at least partially concurrently, and sub-step 404c happens after each of the other sub-steps has been completed. Other embodiments may process the sub-steps thereof in any sequence, partially concurrently, or completely concurrently without deviating from the teachings disclosed herein.

In the depicted embodiment, pins 6 and 14 are monitored for an expected impedance with respect to a ground for a CAN signal. A CAN signal will exhibit an impedance of 50-70 ohms on each pins 6 and 14 with respect to ground. In the depicted embodiment, each of pin 6 and pin 14 are expected to exhibit an impedance of 60 ohms with respect to ground. Some tolerances may additionally be exhibited, such as 10% variance from the impedance, without deviating from the teachings disclosed herein.

The impedance across pins 6 and 14 are additionally monitored for an expected impedance. A CAN protocol will exhibit an impedance of 100-140 ohms between pins 6 and 14. In the depicted embodiment, the expected impedance between pin 6 and pin 14 is 120 ohms. Some tolerances may additionally be exhibited, such as 10% variance from the impedance, without deviating from the teachings disclosed herein.

At step 406, if each of pins 6 and 14 exhibit the expected impedance in their respective sub-steps of step 404, it is understood that the diagnostic port utilizes a CAN protocol, and this protocol is designated as the protocol for use at step 408. If one or both pins do not exhibit the expected impedance, a CAN protocol cannot be inferred, and instead the method continues to step 410, where a next protocol from an ordered list of compatible protocols is tested instead. In the depicted embodiment, the ordered list of compatible protocols may include ISO 9141, ISO 14230, J1850 VPW, or J1850 PWM. Other embodiments may comprise a different combination of protocols having different or additional protocols without deviating from the teachings disclosed herein. Other embodiments may comprise a different order within the ordered list of protocols without deviating from the teachings disclosed herein.

If the next protocol is not confirmed to be the correct protocol for use at step 412, the method proceeds to step 414 where it is determined as to whether the ordered list of compatible protocols has been exhausted. If the list has been exhausted, the method ends at step 416, because the vehicle under service does not utilize a diagnostic protocol that is compatible with the diagnostic tool. However, if the ordered list has not been exhausted, the method instead returns to step 410, where the next protocol of the ordered list is tested.

When a compatible protocol is found and confirmed to be appropriate for use with the vehicle at step 412, the method proceeds to step 418 where the protocol is designated for use in the service.

Once a protocol is designated for use (either at step 408 with the CAN protocol or at step 418 with one of the compatible protocols from the ordered list), the method proceeds to step 420 to requested vehicle identification data from the vehicle under service. In the depicted embodiment, vehicle identification data comprises a vehicle identification number (VIN), but other embodiments may utilize different or additional data for vehicle identification purposes without deviating from the teachings disclosed herein. After receipt of the vehicle identification data is received from the vehicle, the vehicle is identified by its make, model, and year of manufacturer at step 422. Once the diagnostic protocol, make, model, and year of manufacture are identified, the service has been properly instantiated, and different methods for service actions or diagnostic actions may proceed.

While exemplary embodiments are described above, it is not intended that these embodiments describe all possible forms of the disclosed apparatus and method. Rather, the words used in the specification are words of description rather than limitation, and it is understood that various changes may be made without departing from the spirit and scope of the disclosure as claimed. The features of various implementing embodiments may be combined to form further embodiments of the disclosed concepts.

What is claimed is:

1. A method for instantiating a vehicle diagnostic action, the method comprising:
    establishing electrical contact between a diagnostic tool and a plurality of pins of a diagnostic port of a vehicle;
    monitoring a first pin and a second pin for messages conforming to a first diagnostic protocol;
    in response to reception of a message conforming to the first diagnostic protocol within a predefined observation window, designating the first diagnostic protocol as a designated protocol for use by the diagnostic tool;
    in response to not receiving a message conforming to the first diagnostic protocol within the predefined observation window
        monitoring a first pin for a first expected voltage behavior with respect to a neutral ground,
        monitoring a second pin for a second expected voltage behavior with respect to the neutral ground,
        in response to both the first pin exhibiting the first expected voltage behavior and the second pin exhibiting the second expected voltage behavior, designating the first diagnostic protocol as the designated protocol,
        in response to the first pin not exhibiting the first expected voltage behavior or the second pin not exhibiting the second expected voltage behavior, initiating an ordered protocol selection to designate the designated protocol from an ordered list of compatible diagnostic protocols;
    transmitting a request for vehicle identification data from the diagnostic tool to the diagnostic port in the designated protocol; and
    generating a make and model of the vehicle in response to receiving the vehicle identification data from the diagnostic port.

2. The method of claim 1, wherein the diagnostic port comprises an onboard diagnostic (OBD) port, the first pin is pin 6 of the OBD port, and the second pin is pin 14 of the OBD port.

3. The method of claim 1, wherein the first diagnostic protocol is a Controller Area Network (CAN) protocol.

4. The method of claim 3, wherein the ordered list of compatible diagnostic protocols further comprises an ISO 9141 protocol, an ISO 14230 protocol, a J1850 VPW protocol, or a J1850 PWM protocol.

5. The method of claim 3, wherein the first expected voltage behavior is a dynamic voltage with an average peak value between 0V and 5V, and the second expected voltage behavior is a dynamic voltage with an average peak value between 0V and 5V.

6. The method of claim 5, wherein the first expected voltage behavior is a dynamic voltage with an average peak value of 2.5V and the second expected voltage behavior is a dynamic voltage with an average peak value of 2.5V.

7. The method of claim 1, first expected voltage behavior is a dynamic voltage with an average peak value between 0V and 5V, and the second expected voltage behavior is a dynamic voltage with an average peak value between 0V and 5V.

8. The method of claim 7, wherein the first expected voltage behavior is a dynamic voltage with an average peak value of 2.5V and the second expected voltage behavior is a dynamic voltage with an average peak value of 2.5V.

9. The method of claim 1, wherein the vehicle identification data comprises a vehicle identification number (VIN).

10. A method for instantiating a vehicle diagnostic action, the method comprising:
    establishing electrical contact between a diagnostic tool and a plurality of pins of a diagnostic port of a vehicle;
    monitoring a first pin and a second pin for messages conforming to a first diagnostic protocol;
    in response to reception of a message conforming to the first diagnostic protocol within a predefined observation window, designating the first diagnostic protocol as a designated protocol for use by the diagnostic tool;
    in response to not receiving a message conforming to the first diagnostic protocol within the predefined observation window
        measuring a first impedance experienced by the diagnostic tool between a first pin and a neutral ground,
        measuring a second impedance experienced by the diagnostic tool between a second pin and a neutral ground,
        comparing the first impedance and the second impedance to an expected impedance,
        in response to both the first impedance and second impedance exhibiting the expected impedance, designating a first diagnostic protocol as the designated protocol,
        in response to one of the first impedance or second impedance not exhibiting the expected impedance, initiating an ordered protocol selection to designate the designated protocol from an ordered list of compatible diagnostic protocols;
    transmitting a request for vehicle identification data from the diagnostic tool to the diagnostic port in the designated protocol; and
    generating a make and model of the vehicle in response to receiving the vehicle identification data from the diagnostic port.

11. The method of claim 10, wherein expected impedance is between 50 ohms and 70 ohms.

12. The method of claim 11, wherein the expected impedance is 60 ohms.

13. The method of claim 10, wherein the expected impedance is a first expected impedance, and the method further comprises the steps of:
    measuring a third impedance experienced by the diagnostic tool between the first pin and the second pin;
    comparing the third impedance to a second expected impedance;
    in response to the first impedance exhibiting the first expected impedance, the second impedance exhibiting the first expected impedance, and the third impedance exhibiting the second expected impedance, designating the first diagnostic protocol for use by the diagnostic tool as the designated protocol; and
    in response to one of the first impedance not exhibiting the first expected impedance, the second impedance not exhibiting the first expected impedance, or the third impedance not exhibiting the second expected impedance, initiating the ordered protocol selection to designate the designated protocol from an ordered list of compatible diagnostic protocols.

14. The method of claim 13, wherein the second expected impedance is between 100 ohms and 140 ohms.

15. The method of claim 14, wherein the second expected impedance is 120 ohms.

16. The method of claim 10, wherein the diagnostic port comprises an onboard diagnostic (OBD) port, the first pin is pin 6 of the OBD port, and the second pin is pin 14 of the OBD port.

17. The method of claim 10, wherein the first diagnostic protocol is a Controller Area Network (CAN) protocol.

18. The method of claim 17, wherein the ordered list of compatible diagnostic protocols further comprises an ISO 9141 protocol, an ISO 14230 protocol, a J1850 VPW protocol, or a J1850 PWM protocol.

19. A method for selecting a diagnostic protocol to be used by a diagnostic tool during a diagnostic action of a vehicle, the method comprising:
   establishing electrical contact between the diagnostic tool and a plurality of pins of a diagnostic port of the vehicle;
   monitoring a first pin and a second pin for messages conforming to a Controller Area Network (CAN) protocol;
   in response to reception of a message conforming to the CAN protocol within a predefined observation window, designating the CAN protocol as a designated protocol for use by the diagnostic tool; and
   in response to not receiving a message conforming to the CAN protocol within the predefined observation window
   monitoring a first pin for a first expected voltage behavior with respect to a neutral ground,
   monitoring a second pin for a second expected voltage behavior with respect to the neutral ground,
   in response to both the first pin exhibiting the first expected voltage behavior and the second pin exhibiting the second expected voltage behavior, designating the CAN protocol as the designated protocol,
   in response to the first pin not exhibiting the first expected voltage behavior or the second pin not exhibiting the second expected voltage behavior, initiating an ordered protocol selection to designate the designated protocol from an ordered list of compatible diagnostic protocols,
   wherein
   the ordered protocol selection comprises testing each of the ordered list of compatible diagnostic protocols until a compatible diagnostic protocol is found to be in use by the diagnostic port.

20. The method of claim 19, wherein the order list of compatible diagnostic protocols comprises wherein the ordered list of compatible diagnostic protocols further comprises an ISO 9141 protocol, an ISO 14230 protocol, a J1850 VPW protocol, or a J1850 PWM protocol.

* * * * *